United States Patent

Sakata et al.

[11] Patent Number: 4,724,060
[45] Date of Patent: Feb. 9, 1988

[54] SPUTTERING APPARATUS WITH FILM FORMING DIRECTIVITY

[75] Inventors: Masao Sakata; Hideaki Shimamura, both of Kanagawa; Shigeru Kobayashi, Tokyo; Tsuneyoshi Kawahito, Kanagawa; Tsuneaki Kamei, Kanagawa; Katsuo Abe, Kanagawa, all of Japan

[73] Assignee: Hitachi, Ltd., Tokyo, Japan

[21] Appl. No.: 797,966

[22] Filed: Nov. 14, 1985

[30] Foreign Application Priority Data

Nov. 14, 1984 [JP] Japan .............................. 59-238354
Nov. 14, 1984 [JP] Japan .............................. 59-238358

[51] Int. Cl.⁴ .......................................... C23C 14/34
[52] U.S. Cl. ................................ 204/298; 204/192.12
[58] Field of Search ............... 204/192 R, 298, 192.1, 204/192.12

[56] References Cited

U.S. PATENT DOCUMENTS

| | | | |
|---|---|---|---|
| 4,170,541 | 10/1979 | Lamont, Jr. ...................... | 204/298 |
| 4,322,277 | 3/1982 | Opresko ......................... | 204/298 X |
| 4,391,034 | 7/1983 | Stuby ............................ | 204/298 X |
| 4,401,546 | 8/1983 | Nakamura et al. .............. | 204/298 |
| 4,410,407 | 10/1983 | Macaulay ...................... | 204/298 X |
| 4,412,907 | 11/1983 | Ito et al. ....................... | 204/298 |
| 4,414,086 | 11/1983 | Lamont, Jr. .................... | 204/298 X |
| 4,414,087 | 11/1983 | Meckel ......................... | 204/298 X |
| 4,428,809 | 1/1984 | Heimbach et al. ............. | 204/298 X |
| 4,474,659 | 10/1984 | Fazlin .......................... | 204/298 X |
| 4,540,466 | 10/1985 | Nishizawa .................... | 204/298 X |

FOREIGN PATENT DOCUMENTS 0154859 9/1985 European Pat. Off. .

OTHER PUBLICATIONS

T. Kennedy, "Chevron Sputtering Catcher", IBM Technical Dislcosure Bulletin, vol. 20, No. 2, 7/77, p. 756.
J. Vossen, "The Preparation... Discharge Technique", The Inst. of Physics, vol. 12, No. 3, 3/79, pp. 159–167.

Primary Examiner—John F. Niebling
Assistant Examiner—Nam X. Nguyen
Attorney, Agent, or Firm—Antonelli, Terry & Wands

[57] ABSTRACT

A target for use in a sputtering technique usually has a flat structure. The present invention has succeeded in endowing sputtering film formation with a directivity in such a way that the surface of the target is provided with recesses thereby to limit the flight directions of sputtering particles.

Alternatively, the directivity can be bestowed by disposing a frame between a substrate to be formed with a film and the flat sputtering target. This measure requires auxiliary means in which a wall is provided at the outer periphery of the sputtering target so as to effectively utilize a plasma.

The present invention actually formed films by the use of the above technique, and has verified the effect thereof. Wide applications are expected in technical fields wherein after forming a microscopic pattern, one or more films need to be further formed.

2 Claims, 23 Drawing Figures

SPUTTERING APPARATUS WITH FILM FORMING DIRECTIVITY

BACKGROUND OF THE INVENTION (1) Field of the Invention

The present invention relates to a planar magnetron sputtering apparatus which forms a thin film by the use of sputtering. More particularly, it relates to a sputtering apparatus of good step coverage by which a substrate to be formed with a film and having a microscopic via-hole or the like as the shape of a stepped part can be formed with the thin film conforming to the shape.

(2) Description of the Prior Art

A conventional planar magnetron sputtering process is described in detail in, for example, a paper by JHON L. VOSSEN, WERNER KERN et al. contained in "Thin Film Processes", ACADEMIC PRESS, 1978.

A material to be sputtered is sputtered and scattered by an inert atomic species heavier than a hydrogen atom, such as Ar, thereby to reach a substrate on which a film is to be formed. The directions of the scattering are controlled according to the cosine law. Therefore, when a stepped part exits on the substrate to be formed with the film, overhangs are formed on the side walls of the step.

The actual film formation by the sputtering is employed for the production of semiconductor devices (ICs, LSIs, etc.) and various thin-film modules (thermal printing heads, etc.). More concretely, it is important as a technique for forming an interconnection layer, a conductor layer and an insulator layer.

As described in, for example, a paper "Vacuum Evaporation and Sputtering Apparatus" by Kitabayashi et al. in 'Denshi Zairyō (Electronics Material)', 1981, Separate Volume, pp. 143-148, there has been developed an apparatus in which a plasma is confined into the vicinity of a target by an electromagnetic field, thereby to efficiently form a film.

Besides, in a paper "Planar Magnetron Sputtering Cathode with Deposition rate Distribution Controllability" by Abe et al. in 'Thin Solid Films', Vol. 96 (1982), pp. 225-233, a double magnetic pole type electromagnet cathode structure is introduced. Here, it is claimed that a semiconductor substrate of large diameter ($\phi$150 mm) can be formed with a uniform film by operating two electromagnets to control an electromagnetic field distribution and to change an erosion diameter at will.

Even with the techniques as mentioned above, however, the microminiaturization of patterns has been attended with the problem that, in a via-hole portion or the like in the case of forming the upper layer of a multilayer interconnection or an object to be formed with a film, already having an interconnection as an under layer, the step coverage becomes insufficient to cause a part where no film is formed.

BRIEF SUMMARY OF THE INVENTION

An object of the present invention is to provide an apparatus which performs sputtering film formation of favorable step coverage. More in detail, it is to provide a planar magnetron sputtering apparatus in which, in order to form a film on a stepped portion having a microscopic via-hole as per the shape of the underlying step, sputtering particles with a directivity are caused to fly onto a substrate for the film formation, thereby making it possible to form the film conforming to the shape of the step.

The present invention is characterized in that inferior film formation coverage attributed to the government of the emission angle distribution of sputtering particles by the cosine law is improved by positively limiting part of the emissive angular extent. That is, the flights of the sputtering particles are physically limited on the side of the emission source of the sputtering particles or/and the side of a substrate to be formed with a film.

DETAILED DESCRIPTION

In order to promote a better understanding of the present invention, the description of the present invention will be started from some explanation of the principles of the sputtering technique.

Figure 20:
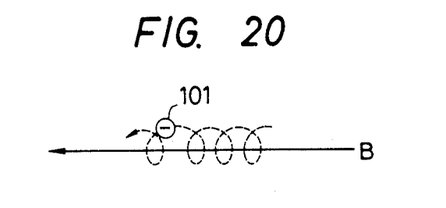
FIG. 20 is a view for explaining a cycloidal motion of an electron.

(A) In a sputtering apparatus, a glow discharge must be maintained within a space of reduced pressure. An electron generated by the discharge performs a cycloidal motion so as to wind round a magnetic field vector $|B$ (FIG. 20). Therefore, the mean free path (hereinbelow, abbreviated to 'mfp') of the electron apparently lengthens. This effect increases the probability of the collision of the electron with the particles of a sputtering gas (usually, the particles of an inert gas such as argon gas), to generate an intense glow discharge. In a recess in a target member shown in FIG. 21, an electron moves to the bottom thereof owing to a motion based on a magnetic field $|B$ and an electric field $|E$. This electron performs the motion also in the bottom portion of the recess. More specifically, when the electron 101 has approached a recess side wall 201, it is repelled by the electric field of the target at a great minus potential and is pushed back in the direction opposite to that of the motion. However, the electron is advanced toward the recess side wall 201 by the force of the motion again, whereupon it is pushed back under the repulsive force of the electric field again. It continues such motions. Therefore, the mfp enlarges, and the intense glow discharge can be sustained even under a pressure of or below $10^{-3}$ Torr which is a pressure atmosphere in ordinary sputtering.

Figure 21:
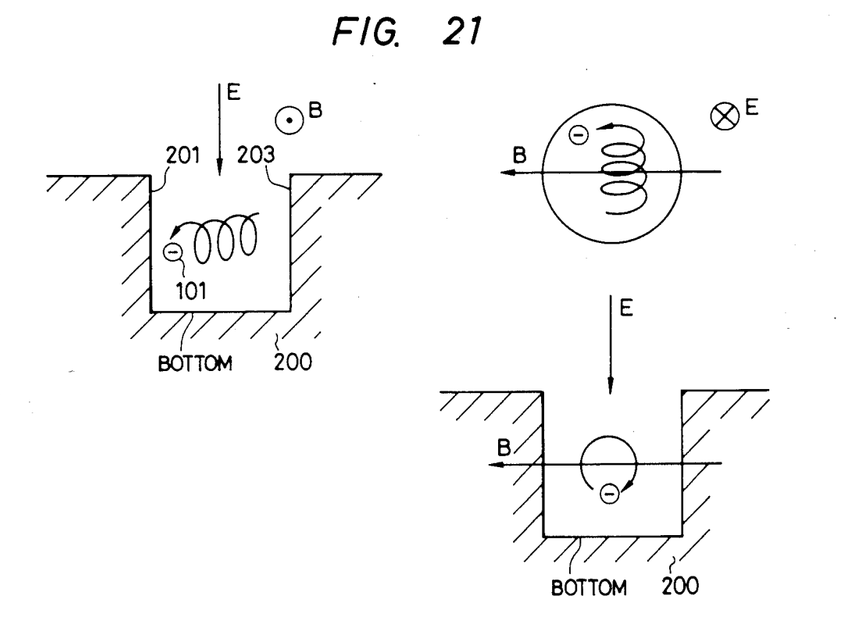
FIG. 21 is a view for explaining a magnetron discharge in a target recess.

Since, in this manner, the glow discharge arises also within the recess provided in the target member, it has become possible to endow the emission directions of the sputtering particles with a directivity by means of the target member provided with the recesses as one embodiment of the present invention.

Figure 22:
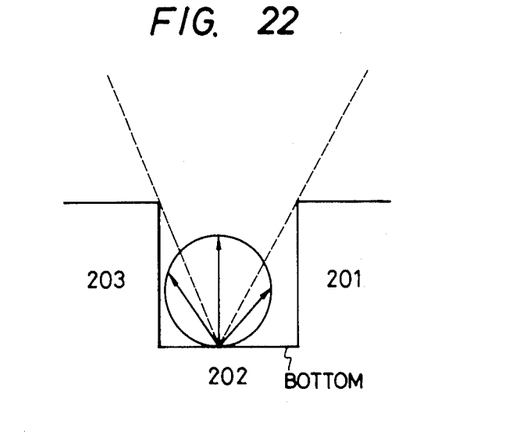
FIG. 22 is an explanatory view of the impartation of a directivity of sputtering particles by a recess formed in the target.

More specifically, the discharge concentrates in the recess bottom portion, it concentrates in the recess, and the sputtering phenomenon is induced by the gas ionized plus within the recess. In this regard, the sputtering particles which are emitted according to the ordinary cosine law within the recess have the emission angle distribution thereof limited in accordance with a solid angle defined when a space above the principal surface of the target is viewed from with the recess. FIG. 22 illustrates that the angle of emission of sputtering particles from one point of the recess bottom conforms with the cosine law if side walls are not provided, but that the sputtering particles are blocked by the recess side walls 201 and 203 to undergo an angular distribution. Therefore, and none of an overhang shape etc. arises on the stepped portion of a substrate for film formation at all times, so that favorable film characteristics can be maintained.

(B) As already stated, in the case where the stepped portion exists on the substrate to be formed with the film, the inferior step coverage of the stepped portion is attributed to the fact that the incidence of the sputtering particles on the substrate conforms with the cosine law. That is, the sputtering particles incident on the substrate perpendicularly are smaller in number than the particles incident at any other angles, so that overhangs are formed on the stepped portion to worsen the step coverage.

Accordingly, it is necessary for the betterment of the step coverage to endow the emission source of sputtering particles with a directivity or to limit the angle of incidence of sputtering particles to be incident on a substrate for film formation.

The worsening of the coverage ascribable to the cosine law will be described with reference to FIG. 23.

Figure 23:
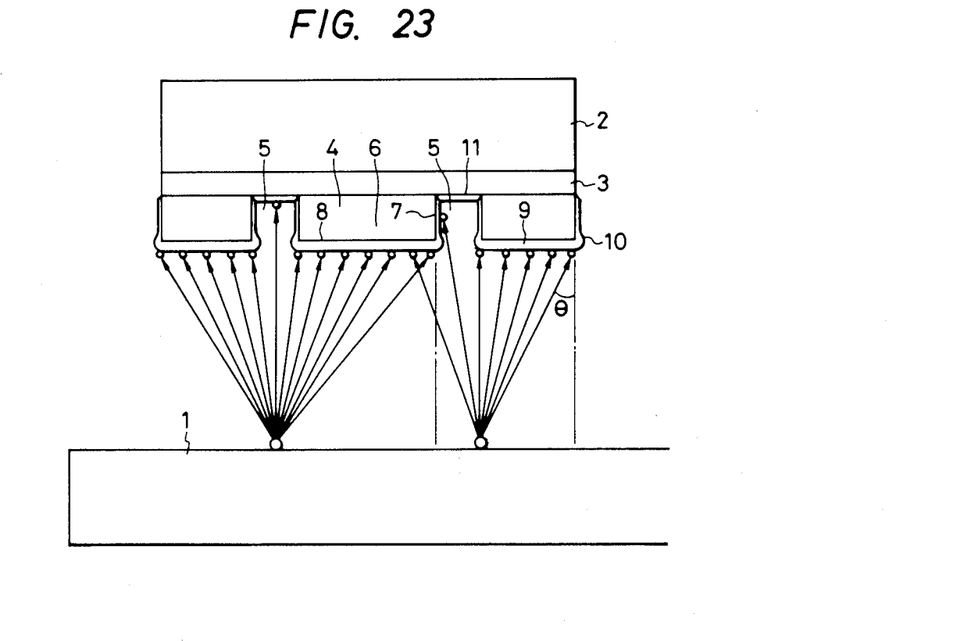
FIG. 23 is a schematic view of a sputtering apparatus in a prior art.

In FIG. 23, a target material is sputtered from a sputtering target 1 to a wafer 2. This wafer is previously formed with a first layer of interconnection 3, an inter-layer insulator film 4, and via-holes 5 provided in the inter-layer insulator film. The angle of incidence of a sputtering particle on the wafer, with respect to a line perpendicular to the plane of the wafer is denoted by $\theta$ as indicated in this figure. Here, let's consider the formation of a film on a stepped portion 6 defined by the via-holes 5. On the side surface 7 of the stepped portion 6, no particle enters the wafer from a target part lying on the left side of a line which is drawn perpendicularly from a point on the side surface 7 to the targert 1, so that the number of incident particles on the side surface 7 is naturally smaller than on the top surface part 8 of the step. Consequently, the amount of film formation on the step top surface 8 becomes larger, and the particles having incided and deposited on the step top surface as indicated at numeral 9 in FIG. 23 form overhang parts 10. When the overhang parts have been formed, the number of the incident particles on the side surface 7 decreases more. In addition, the size of the via-hole 5 is often set at a value equal to or smaller than the thickness of the insulator film 4. In such a case, also the number of incident particles on the bottom part 11 of the via-hole decreases on account of the stepped portion 6 and the overhang parts 10.

These phenomena arise because of the larger amount of film formation based on the incident particles whose angles $\theta$ indicated in FIG. 23 are large, and by removing the particles incident at the large angles $\theta$, the betterment of the coverage is achieved as indicated by another embodiment of the present invention. To this end, as shown in FIG. 17, a frame 12 is disposed in the space between a target 1 and a wafer 2 to remove the incident particles of large angles $\theta$.

Figure 17:
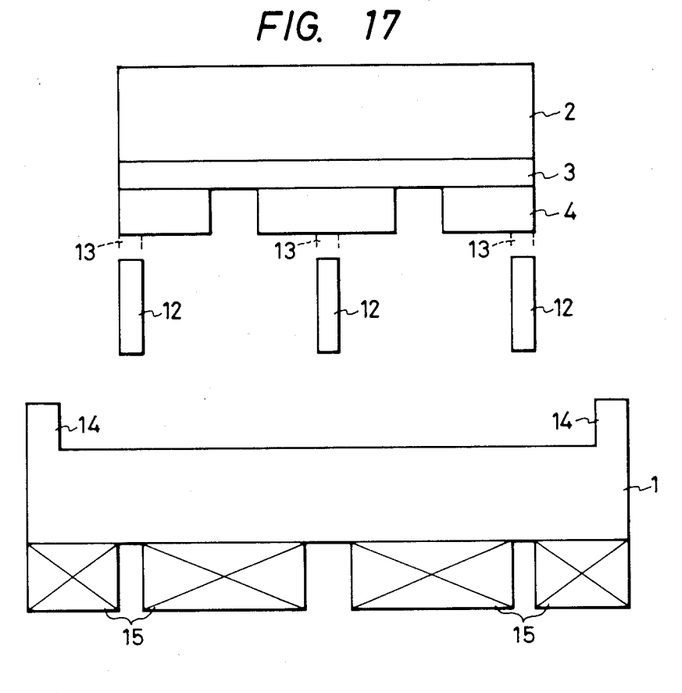
FIG. 17 is a conceptual view showing another embodiment of the present invention.

In FIG. 17, substrate parts (2, 3, 4) are depicted in $\mu$m in the thickness direction thereof, and the other parts are depicted in mm. That is, the substrate parts are magnified to 1,000 diameters in the thickness direction as compared with the other parts.

When the frame 12 is provided as shown in FIG. 17, there arise the problems of (1) decrease in the rate of film formation on the wafer and (2) lowering in the amount of film formation in a part 13 shaded by the frame. The new problems are solved by contriving (1) a measure wherein a substrate such as the wafer is continuously rotated or moved in parallel, thereby to control a film thickness distribution within the substrate, (2) a measure wherein a protrusion 14 made of the same material as the target material is provided at the peripheral part of the target, and it is held at the same potential as that of the target, thereby to increase the amount of sputtering on the basis of an increased number of electrons staying near the target, (3) a measure wherein currents which are applied to electromagnets 15 being magnetic field generation means are changed, thereby to effectively utilize the target material, and so forth.

(C) Now, embodiments of the present invention will be described with reference to the drawings.

Figure 1:
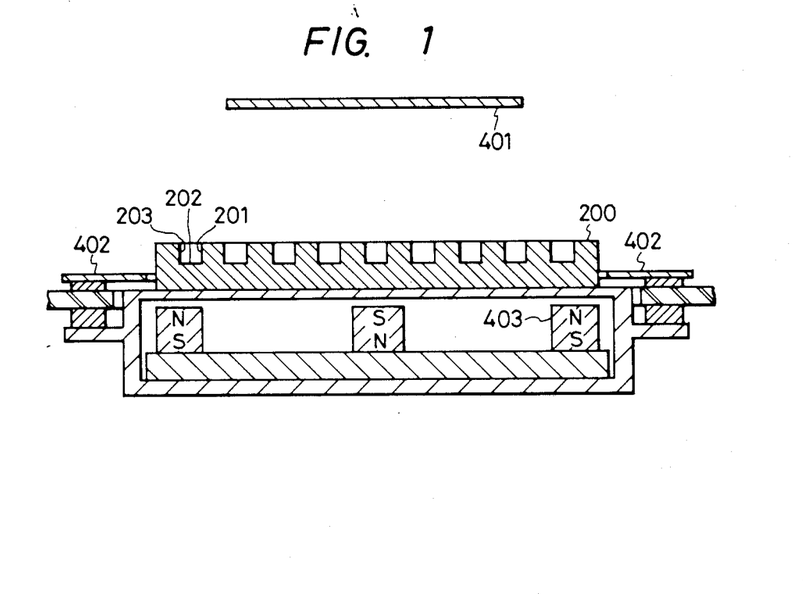
FIG. 1 is a view showing an embodiment of the present invention.
Figure 2:
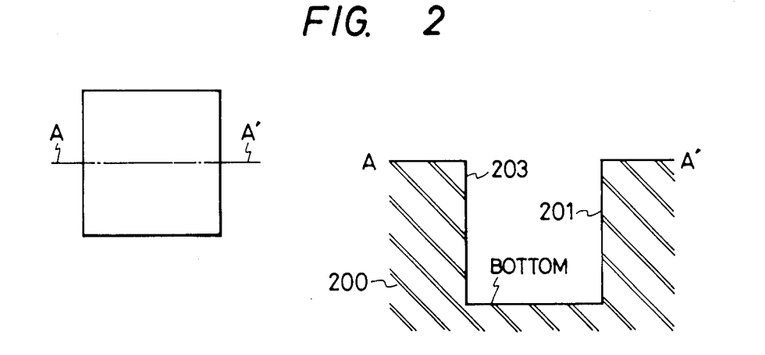
FIG. 2 is a sectional view showing the recess of a target for film formation.

FIG. 1 shows a sectional view of a planar magnetron sputtering apparatus which is the first embodiment. An evacuation system, a radio electric power source, etc. which are not pertinent to the present invention are not shown. Referring to FIG. 1, the sputtering apparatus has a target with recesses made of Al 200 and employs a permanent magnet 403 as magnetic field generation means. The permanent magnet 403 generates a magnetic field orthogonal to an electric field which enters perpendicularly to the principal plane of the target 200 and the plane of the bottom 202 of each recess. Numeral 401 in the figure designates a substrate to be formed with a film, and numeral 402 an anode. Using the embodiment shown in FIG. 1, argon gas is introduced into the space between the target 200 and the substrate for film formation 401, and a great minus voltage is applied to the target 200 to induce the glow discharge, and to sputter the target 200, whereby sputtering particles of the target material are formed as the thin film on the substrate for film formation 401.

The function and effect of the present embodiment will be described below.

Figure 3:
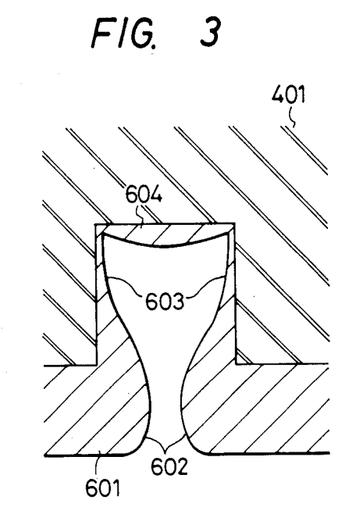
FIGS. 3 and 4 are sectional views for explaining of a substrate after films have been formed.
Figure 4:
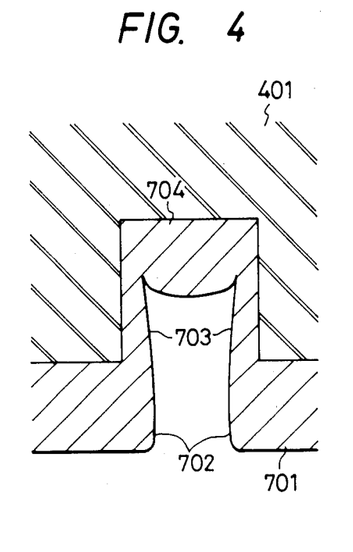
Figure 5:
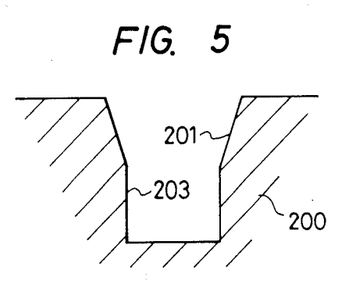
FIGS. 5 through 11 are views each showing a modification of a recess formed in a recess in a target in FIG. 1.
Figure 6:
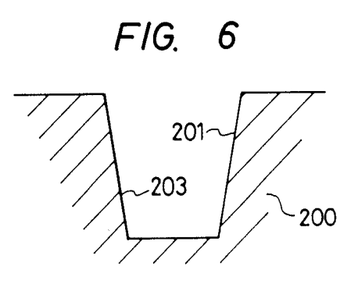
Figure 7:
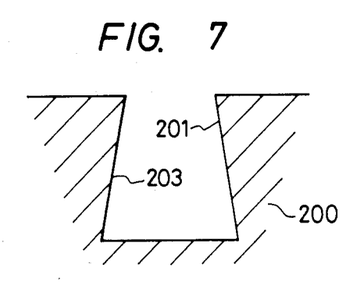
Figure 8:
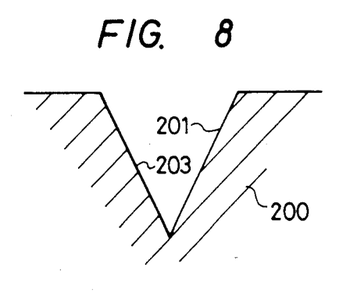
Figure 9:
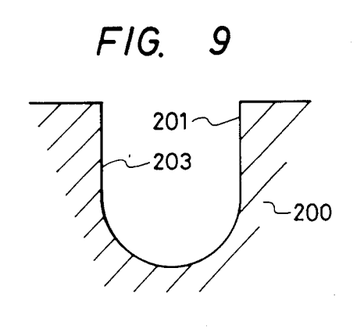
Figure 10:
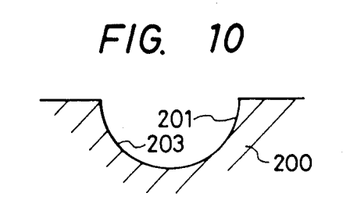
Figure 11:
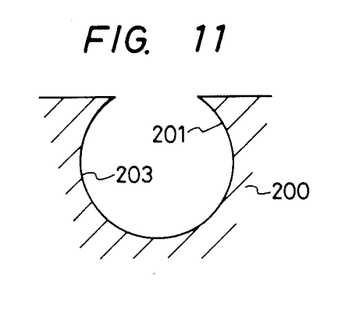

FIGS. 3 and 4 show the shape of the via-hole of the substrate for film formation (dimensions of the via-hole: 1.5 μm×1.5 μm, dimensions of a step: 1.5 μm).

FIG. 3 shows a result obtained when the via-hole portion was formed with a film 1 μm thick without employing the target with recesses according to the present invention. The Al film 601 exhibited the shape of an overhang 602 at the stepped part of the via-hole, and it was hardly formed on the side walls 603 of the via-hole and the bottom 604 thereof.

FIG. 4 shows a shape obtained when an Al film was formed by 1 μm by the use of the embodiment shown in FIG. 1. In this case, the Al film 701 scarcely formed an overhang at the stepped part 702 of the via-hole, and Al films 0.3 μm and 0.8 μm thick were respectively formed on the side walls 703 of the via-hole and the bottom 704 thereof.

FIGS. 5 thru 11 show modifications of the present embodiment. They illustrate the sectional shapes of with recesses targets (corresponding to the element 200 in FIG. 1) for use in the present embodiment.

Figure 12:
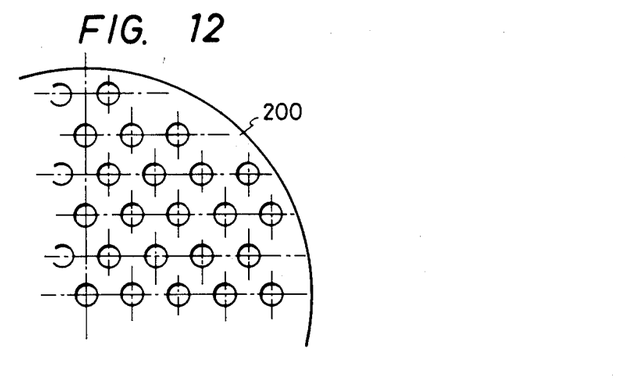
FIG. 12 is a front view showing the distribution of the recesses formed in the target in FIG. 1.
Figure 13:
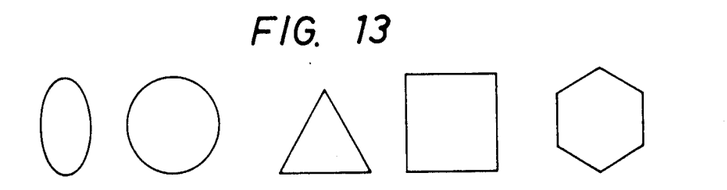
FIG. 13 is a view showing modifications of the front shape of the recess formed in the target in FIG. 1.
Figure 14:
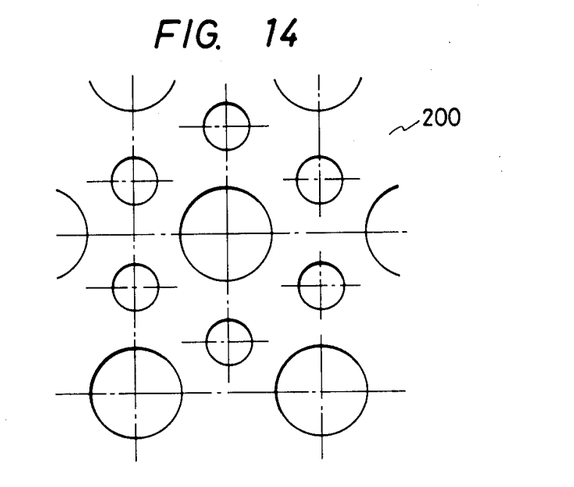
FIG. 14 is a front view showing another example of the distribution in FIG. 12.
Figure 15:
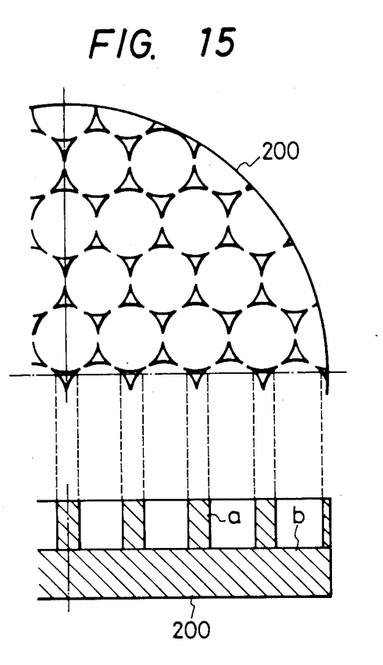
FIG. 15 shows a front view and a sectional view of pillars which define a configuration equivalent to that of the recesses formed in the target in FIG. 1.
Figure 16:
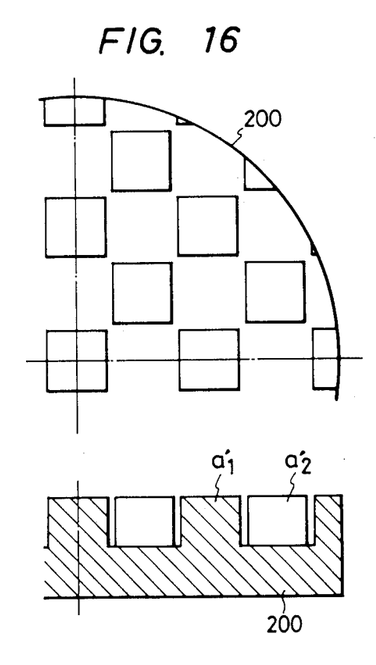
FIG. 16 shows another modification of the recesses referred to in FIG. 15.

FIG. 12 shows the arrangement of the recesses in the target, while FIG. 13 shows modifications of the shapes of the recesses of the target viewed in plan. In order to increase the area of the recesses in the target, larger and smaller recesses may be combined as illustrated in FIG. 14, or columnar protrusions may be formed on the upper side of the target to equivalently form recesses as illustrated in FIG. 15 or FIG. 16.

According to the present embodiment, the directivity of the sputtering particles which fly and come from the target member is enhanced, and favorable film deposition characteristics free from the overhang shape can be attained.

By way of example, when a stepped portion of a substrate corresponding to a via-hole 2 μm in diameter and 2 μm in depth is formed with a film at a film formation rate of approximately 0.8 μm/minute, the film is deposited to a thickness of 0.4 μm on the side walls of the stepped portion, and favorable film deposition characteristics free from an overhang shape can be attained.

Figure 18:
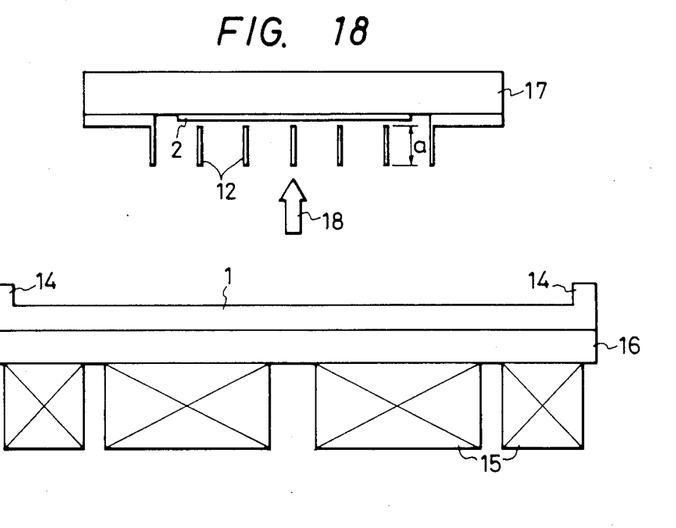
FIG. 18 is a schematic sectional view of the sputtering apparatus in FIG. 17.
Figure 19:
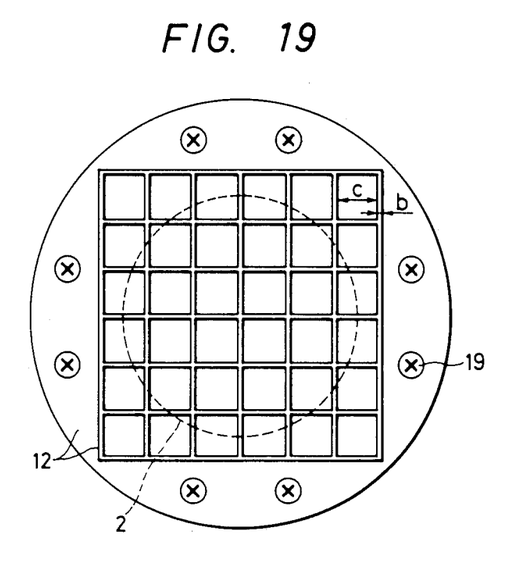
FIG. 19 is a schematic plan view of the vicinity of a substrate holder in FIG. 17.

FIGS. 17 thru 19 show an embodiment in which a frame is disposed directly in front of a substrate to the end of limiting the incident angle of sputtering particles that enter the substrate for film formation.

Let's exemplify a case where an Al film 1 μm thick as a first layer of interconnection and a polyimide film 2 μm thick as an inter-layer insulator film are successively formed on a silicon waver of φ100 mm (100 mm in diameter) and where via-holes of φ2 μm are formed in the polyimide resin. The resulting wafer is set in the sputtering apparatus of he present embodiment illustrated in FIGS. 18 and 19. In this case, FIG. 18 is a sectional view of a target part and a substrate holder part within the sputtering apparatus, while FIG. 19 is a view of the substrate holder part seen in the direction of an arrow 18 in FIG. 18. The sputtering apparatus shown in FIGS. 18 and 19 is such that a target 1 which is of φ260 mm and which is made of Al is formed at its peripheral part with a protrusion 14 having a height of 10 mm, and that it is bonded to a backing plate 16. Besides, electromagnets 15 are arranged on the rear surface of the backing plate 16 and are shaped into a double ring, and applied currents to the respective electromagnets can be changed independently of each other. In addition, the silicon wafer 2 is set on a substrate holder 17, to which the frame 12 is thereafter fixed by screws 19. By way of example, the frame 12 was so shaped that the height a (FIG. 18) thereof was 19 mm and that the frame width b (FIG. 19) thereof was 0.5 mm, and each subdivision defined by the frame was in the shape of a regular square on side c (FIG. 19) of which was 19.5 mm. The distance between the wafer and the plane of the target was 80 mm. With this sputtering apparatus, the target material was sputtered for 1 minute 25 seconds under the conditions that the gaseous pressure of Hr to be sputtered was 3 mTorr, that a voltage applied to the target was 500–600 V, that a target current was 12 A, and that the applied currents to the electromagnets 15 were 3–6 A for the inner electromagnet (1350 turns) and 8–0 A for the outer electromagnet (350 turns). During the sputtering, the substrate holder 17 was rotated while being moved in parallel with the plane of the target 1. As a result, the Al film was formed to a thickness of 1.0 μm on the upper surface part of the via-hole step and to a thickness of 0.9 μm on the bottom of the via-hole, and an uncovered part on the side surface of the stepped portion did not arise. For the sake of comparison, using the prior-art sputtering apparatus which was not furnished with the frame 12 and the protrusion 14 of the target, the target material was sputtered for 50 seconds under the same sputtering conditions as mentioned above. As a result, the deposited Al film was 1.0 μm thick on the top surface of the via-hole step and 0.6 μm thick on the bottom of the via-hole, the overhang part as shown in FIG. 23 was formed, and uncovered parts appeared on the side surfaces of the step.

In FIG. 23, the substrate is depicted on enlarged scale in the thickness direction thereof. More concretely, dimensions in the thickness direction of the substrate are taken in μm, and the other dimensions in mm.

It is understood that the uniform film formation can be carried out by disposing the frame according to the present embodiment, but the rate of film formation lowers to some extent. This is ascribable to the fact that, since the particles emitted from the target material are blocked by the frame, the total quantity of sputtering particles to reach the silicon wafer decreases. By properly selecting the configuration of the frame, accordingly, the step coverage can be improved without extremely lowering the film formation rate. Frames may be changed according to the use of the film formation.

According to the present embodiment, step coverage for a microscopic via-hole portion can be performed without an uncovered part, to bring forth the effect of permitting the formation of a multi-layer interconnection portion of favorable connection reliability in semiconductor devices etc. to be microminiaturized still more. Another effect is that a target which has heretofore required an area about four times larger than the area of a substrate can be rendered substantially as small as the substrate, thereby to sharply enhance the utilization factor of the target.

We claim:

1. A magnetron sputtering apparatus for enabling formation of a multi-layer interconnection having fine steps in a semiconductor device, comprising:
a target member having a substantially planar surface portion and a protrusion at the periphery of the planar surface portion;
means for holding the semiconductor device so that the surface of the semiconductor device faces the surface of the target member, the protrusion of the target member extending in a direction toward the surface of the semiconductor device, the holding means having means for at least one of rotating and moving the semiconductor device in a direction parallel to the surface of the target member;

means for preventing film layer oerhang portions so as to enable formation of a film layer on the fine steps of via-holes of the semiconductor device without overhand portions, the overhang portion preventing means including a plurality of frame members extending perpendicularly, periodically and two-dimensionally proximate to the surface of the semiconductor device;

means for generating a plasma on the target member; and means for magnetically moving the plasma for sputtering sputtered particles from a plurality of portions of the target member;

said frame members having side wall portions for inhibiting sputtered particles flying from the target member in a direction diagonal to the perpendicular direction of the surface of the semiconductor device from impinging on the surface of the semiconductor device so as to prevent the formation of film layer overhang portions on the fine step of the via-holes for the multi-layer interconnection of the semiconductor device.

2. A magnetron sputtering apparatus according to claim 1, wherein the target member is an aluminum member for forming an aluminum film on the semiconductor device.

* * * * *